June 18, 1957 F. PAPOUSCHEK 2,796,469

VARIABLE-SELECTIVITY AMPLIFIER CIRCUITS

Filed July 16, 1953 3 Sheets-Sheet 1

INVENTOR.
Franz Papouschek

BY F.A. Rechif
AGENT

VARIABLE-SELECTIVITY AMPLIFIER CIRCUITS

Filed July 16, 1953 3 Sheets-Sheet 2

INVENTOR.
Franz Papouschek
BY F.A. Rechif
AGENT

June 18, 1957 F. PAPOUSCHEK 2,796,469

VARIABLE-SELECTIVITY AMPLIFIER CIRCUITS

Filed July 16, 1953 3 Sheets-Sheet 3

INVENTOR.
Franz Papouschek

BY F.A. Rechif
AGENT 2,796,469

VARIABLE-SELECTIVITY AMPLIFIER CIRCUITS

Franz Papouschek, Montreal, Quebec, Canada, assignor to Radio Corporation of America, a corporation of Delaware Application July 16, 1953, Serial No. 368,322

2 Claims. (Cl. 179—171)

This invention relates to variable-selectivity circuits, and more particularly to circuits for varying the bandwidth of the intermediate frequency amplifier in a communications receiver, such as a multiband receiver.

This invention constitutes an improvement over my prior copending but now abandoned application, Serial No. 365,505, filed July 1, 1953. In such prior application, a two-stage intermediate frequency amplifier with single-tuned interstage couplings is disclosed, the coupling between the input and the output resonant circuits (separated by an amplifier tube) being changed or varied by means of an additional tube, which also provides inverse feedback. The variation of the amount of backward coupling or inverse feedback provided by the aforementioned additional tube varies correspondingly the bandwidth or selectivity of the amplifier.

The minimum bandwidth passed by the input and output resonant circuits referred to, that is, the bandwidth on the "narrow" position of the selectivity control, is limited by the Q of the circuits. For certain communications receivers, a wide-range selectivity control is required, for example a variation in bandwidth of from 300 cycles on the "narrow" position to 10,000 cycles on the "broad" position. With the prior circuit referred to, to obtain a bandwidth of 300 cycles on an I. F. of say 150 kc., a Q of 320 is necessary for the input and output resonant circuits. However, coils with a Q of 320 are very bulky, and in addition the impedance of the circuit has to be kept to a small value, to avoid additional damping by the tubes. These items are both drawbacks.

Therefore, an object of this invention is to provide a variable-selectivity system in which a very narrow bandwidth can be obtained, while yet employing only conventional coils of small size with Qs not unduly high, for example, approximately 150–200.

Another object is to devise a novel variable-selectivity system utilizing a tube which acts to provide regeneration.

The objects of this invention are accomplished, briefly, in the following manner: In the I. F. amplifier of a radio receiver, a negative or inverse feedback or coupling tube is provided, for coupling energy degeneratively from the output of one stage back to the input of the same stage. In addition, a "regeneration" or positive feedback tube is utilized, for coupling energy derived from the input of one amplifying stage, back to the same point regeneratively. In a modification, both the positive and negative feedback tubes couple energy from the output of one stage back to the input of the same stage. The gain of the I. F. stage is adjusted or controlled simultaneously, or along with, the gains of both the positive and negative feedback tubes, for example by a common potentiometer, to vary the bandwidth of the I. F. stage while keeping the gain thereof more or less constant.

The foregoing and other objects of the invention will be best understood from the following description of some exemplifications thereof, reference being had to the accompanying drawings, wherein.

Figures 1, 2:
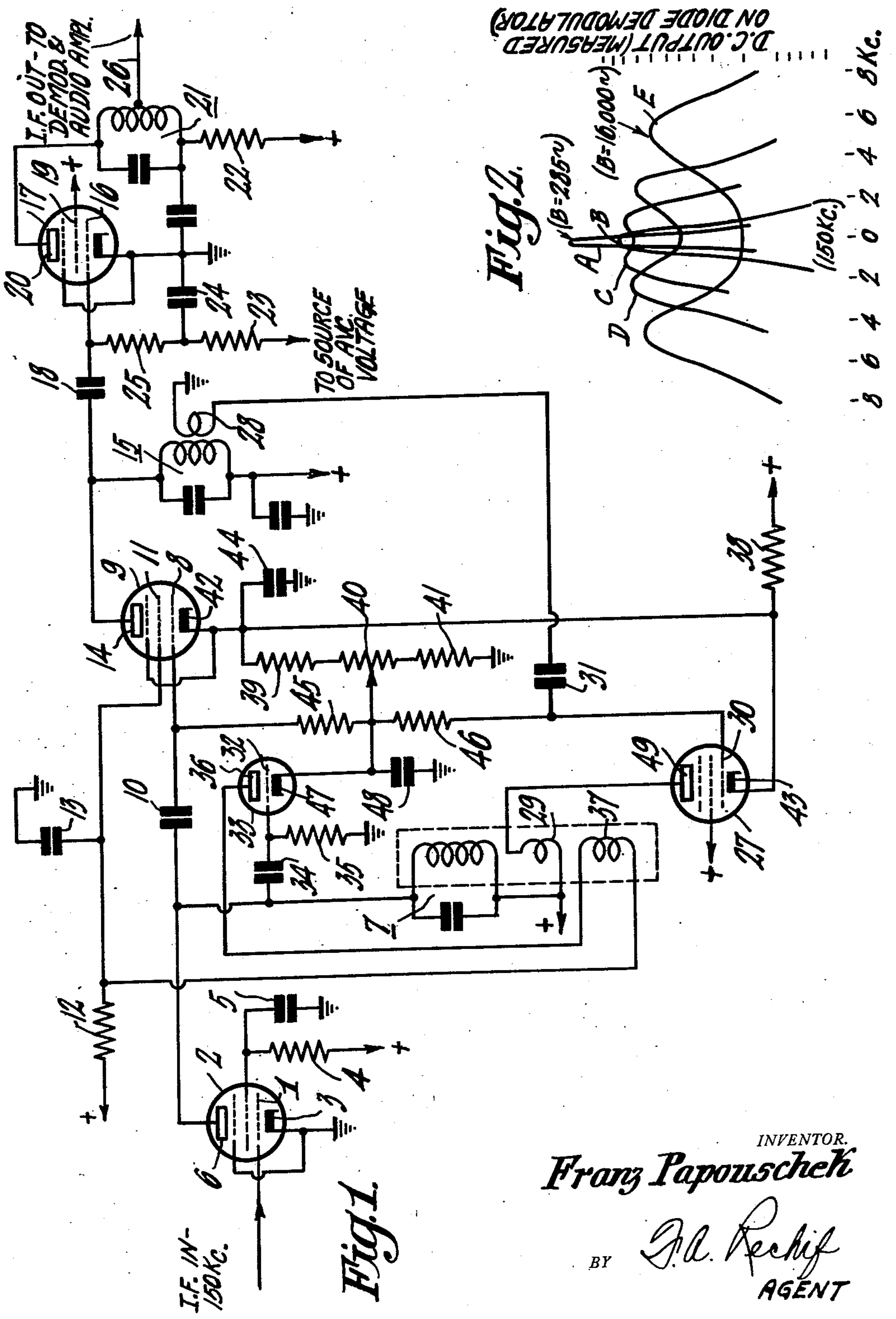
Fig. 1 is a circuit diagram of an arrangement according to this invention.
Figs. 2 and 3 are sets of curves useful in explaining the operation of Fig. 1.

Now referring to the drawings, and particularly to Fig. 1 thereof, there is illustrated one form of variable-selectivity circuit of the invention, which may be embodied in a multiband radio receiver of the well-known superheterodyne type, for controlling the selectivity of the I. F. channel of the receiver. Only a portion of the I. F. channel of the receiver is illustrated in Fig. 1, but it will be understood by those skilled in the art that the receiver may include an R. F. amplifier coupled to a mixer unit in which the receiver R. F. energy is heterodyned down to a first I. F. by means of locally-produced heterodyning energy, followed by a second mixer circuit in which the first I. F. is heterodyned down to a second I. F., on the order of 150 kc., for example, by means of other locally-produced heterodyning energy.

This second I. F. is applied to the control or input grid 1 of a pentode vacuum tube 2 connected as the first stage of the second I. F. amplifier. The cathode 3 of tube 2 is grounded, while the screen grid of this tube is connected to the positive terminal of a suitable source of unidirectional potential through a resistor 4 and is bypassed to ground for radio frequency currents by a capacitor 5. The anode 6 of this tube is connected through a tuned or resonant coupling circuit 7, consisting of an inductance and a capacitance in parallel, to the positive terminal of the unidirectional potential source. The circuit 7, which may be termed the input resonant circuit, has a medium Q (on the order of 150–200, for example), as appropriate for broad selectivity or wide bandwidth.

The amplified I. F. output of the tube stage 2 is applied to the input or control grid 8 of a following pentode vacuum tube 9 through a coupling capacitor 10 connected to the anode end of resonant circuit 7. Since there is only one tuned circuit 7 between tubes 2 and 9, it may be realized that the coupling therebetween is a "single-tuned" coupling. Tube 9 is the second stage of the second I. F. amplifier in the receiver. The screen grid 11 of tube 9 is connected to the positive terminal of the unidirectional potential source through a resistor 12, and is bypassed to ground for I. F. by means of a capacitor 13. The anode 14 of tube 9 is connected through a tuned or resonant coupling circuit 15, consisting of an inductance and a capacitance in parallel, to the positive terminal of the unidirectional potential source. The circuit 15, which may be termed the output resonant circuit, also has a medium Q (on the order of 150–200, for example), as appropriate for broad selectivity or wide bandwidth.

The amplified I. F. output of the tube stage 9 is applied to the input or control grid 16 of a following pentode vacuum tube 17 through a coupling capacitor 18 connected to the anode end of resonant circuit 15. Since there is only one tuned circuit 15 between tubes 9 and 17, it will be realized that the coupling therebetween is a "single-tuned" coupling. Tube 17 is the third stage of the second I. F. amplifier in the receiver. The screen grid 19 of tube 17 is connected to the positive terminal of the unidirectional potential source. The anode 20 of tube 17 is connected through a tuned or resonant coupling circuit 21, consisting of an inductance and a capacitance in parallel, and through a resistor 22, to the positive terminal of the unidirectional potential source. The circuit 21 has a low Q, on the order of 60, for example. An AVC voltage, derived from a suitable source in a more or less conventional manner, is applied to grid 16 through a filtering network including a series resistor 23 and a shunt capacitor 24, by way of a series resistor 25. In this manner, suitable AVC grid bias voltage is applied to grid 16, to control the gain of tube 17 in response to the strength of the signals passing therethrough.

The amplified I. F. output of the tube stage 17 is applied to the input of a demodulator, followed by an audio amplifier and a suitable sound reproducer (not shown), through a lead 26 connected to the inductance of resonant circuit 21. Since the coupling to the following tube stage is effected in this way, it may be realized that the output coupling of the third stage tube 17 to the following stage is a "single-turned" coupling.

In order to couple the circuit 7 (which may be termed the "input resonant circuit") and the circuit 15 (which may be termed the "output resonant circuit") in the backward direction, there is provided inverse feedback means which includes a vacuum tube repeater 27 having its input electrodes (control grid and cathode) coupled to the output circuit 15 by means of a winding 28 inductively coupled to the inductance of circuit 15 and having its output electrodes (anode and cathode) coupled to the input circuit 7 by means of a winding 29 inductively coupled to the inductance of circuit 7. More specifically, one end of winding 28 is connected to control grid 30 of pentode vacuum tube 27 through a capacitor 31, while the other end of winding 28 is connected to ground. Reversal of the polarity of the voltage applied between the input electrodes of the tube 27, relative to the output voltage of the tube 9, is secured by properly poling the winding 28 with respect to the inductance of circuit 15. Also, the coupling between the winding 29 and the inductance of circuit 7 serves to impress the feedback voltage on the input circuit 7 with the correct polarity to cause tube 27 to act as an inverse feedback or backward-coupling tube. Tube 27, in other words, provides a degenerative coupling between output circuit 15 and input circuit 7.

The anode 49 of tube 27 is connected through winding 29 to the positive anode supply and the screen grid of tube 27 is also connected to the positive anode supply, so that tube 27 is connected to act as an amplifier. Vacuum tube 27 is preferably of the pentode type having no appreciable anode-to-grid coupling but having adjustable directive transconductance.

Signal energy appearing at the anode end of circuit 7 is applied to the grid 32 of a triode vacuum tube 33 through a coupling capacitor 34 over a grid leak resistor 35 which is connected between grid 32 and ground. Anode 36 of tube 33 is connected through a coil 37 and resistor 12 to the positive source of unidirectional potential. Coil 37 is inductively coupled to the inductance of resonant circuit 7.

Tube 33 is connected as a regenerative feedback tube or a positive feedback tube, the energy abstracted from the anode circuit of tube 2 (and fed to grid 32 of tube 33) being amplified by triode 33 and fed back regeneratively to input resonant circuit 7. Coil 37 is so related to the inductance of resonant circuit 7 that this feedback is regenerative or in the "positive" direction.

A common variable or adjustable biasing circuit is provided for tubes 9, 27 and 33. In other words, a common potentiometer is used to vary the bias potential applied to all of these tubes (and therefore the gain of each tube) simultaneously. A voltage divider arrangement, consisting of a resistor 38, a resistor 39, a potentiometer 40 and a resistor 41 connected in series in the order named, is connected between the positive terminal of the unidirectional potential source and the negative terminal thereof or ground. The cathode 42 of amplifying tube 9 and the cathode 43 of negative feedback tube 27 are both connected to the common junction of resistors 38 and 39 of this voltage divider, and are bypassed to ground by means of a capacitor 44. The movable arm or wiper of the potentiometer 40 is connected through a resistor 45 to control grid 8 of tube 9, and is also connected through a resistor 46 to control grid 30 of tube 27. In this way, variable or adjustable bias potentials are applied between the grids and cathodes of tubes 9 and 27, and variation of the arm on potentiometer 40 causes the gains of these two tubes to be varied simultaneously.

The cathode 47 of positive feedback tube 33 is connected to the movable arm of the potentiometer 40 and is bypassed to ground by a capacitor 48. In this way, a variable or adjustable bias potential is applied between the cathode and grid of tube 33 (the grid 32 of tube 33 is at zero D. C. potential), and variation of the arm on potentiometer 40 also causes the gain of tube 33 to be varied, simultaneously or concomitantly with the gains of tubes 9 and 27. It will be noted that the cathode 47 of tube 33 is connected to the wiper of potentiometer 40, while the grids of tubes 27 and 9 are connected to this same wiper. Therefore, movement or variation of said wiper varies the gain of tube 33 inversely or oppositely to that of tubes 9 and 27. The bias potentials applied to grids 8 and 30 of respective tubes 9 and 27 are generally negative with respect to the potentials of the respective cathodes 42 and 43. The bias potential applied to cathode 47 of tube 33 is generally positive with respect to ground (the potential of grid 32).

The backward (negative or inverse feedback) coupling means including the tube 27 is substantially non-selective with respect to frequency, the circuit constants of the backward coupling circuit being so proportioned as to render this means substantially less frequency-selective than the resonant circuits 7 and 15. This prevents the system from oscillating and insures stability of operation at all frequencies within the band to be transmitted through the system.

In considering the operation of the selector system, it will be seen that the single tube 9 causes a reversal in phase, so that the alternating voltages on the input circuit 7 are reversed in phase once; therefore the alternating voltages across the output circuit 15 are substantially out of phase with the voltages across the input circuit 7, at frequencies in the vicinity of the resonant frequencies of the circuits 7 and 15, at which frequencies these circuits are substantially resistive. By including the single tube 27 in the backward coupling path, with the phase-reversing coupling of winding 28 to the inductance of circuit 15, however, the feedback voltages impressed on the input circuit 7 through this path are substantially reversed in phase, at the frequencies indicated, with respect to the input voltages impressed directly upon this circuit. If the circuits 7 and 15 have the same resonant frequencies, which is the preferred arrangement, the input and feedback voltages will, under these conditions, be almost exactly in phase opposition. At these frequencies the circuits 7 and 15 also have their maximum impedance, so that the gains of the tubes 9 and 27 are a maximum and the voltages developed across the circuit 15 and the feedback voltages are both a maximum. Therefore, the system is degenerative to the maximum degree at these frequencies.

At frequencies substantially above the resonant frequencies of the circuits 7 and 15, these circuits are capacitively reactive so that the voltage across circuit 15 lags the input voltage by a value approaching 90°, while the feedfack voltage impressed upon the input circuit 7 is retarded by an additional amount also approaching 90° so that the feedback voltages are substantially in phase with the input voltages. However, at these frequencies, the impedances of the circuits 7 and 15 are substantially less than at resonance, reducing the gains of the stages including tubes 9 and 27, and thus reducing the feedback voltages. Therefore, the system is slightly regenerative. At frequencies intermediate those just discussed, the feedback voltages have intermediate amplitudes and phase angles with respect to the input voltages and the feedback characteristic of the system has a gradual transition from degeneration to regeneration. Obviously, at frequencies below the resonant frequencies of the circuits 7 and 15, the same relationships between the magnitude and phase of the feedback voltages exist except that, at these frequencies, the feedback voltages are subject to leading instead of lagging phase shift.

To summarize the foregoing, at frequencies in the vicinity of the mean resonant frequency of the system, the feedback voltages are opposite in phase to the input voltage, and therefore the feedback is degenerative; at frequencies displaced more than a certain amount above and below such mean resonant frequency, the feedback is regenerative. In other words, the backward coupling between circuits 7 and 15 operates to decrease the responsiveness of the system at frequencies within the band in the vicinity of the resonant frequencies of the two circuits, and to increase the responsiveness of the system symmetrically at frequencies substantially above and below the resonant frequencies.

By varying the transconductance of tube 27 to vary the amount of backward coupling, the width of the band transmitted through the I. F. channel of the receiver may easily be varied. A narrow bandwidth, corresponding to zero backward coupling or feedback, can be obtained by adjusting the arm of the potentiometer 40 to increase the negative potential applied to the control electrode 30 of the tube 27 to a sufficiently high value to reduce the transconductance of the tube to a negligible value. Thus, for the narrow bandwidth position the gain of the tube 27 is a minimum. When the bias potential is adjusted to increase the transconductance of tube 27 to an intermediate value, the bandwidth is increased. With small feedback voltages the degenerative action is appreciable at frequencies near the mean resonant frequency of the system, while the phase and magnitude of the feedback voltage components of frequencies above and below the mean resonant frequency are such that the regenerative action is of no appreciable effect. A further increase in the transconductance of the tube 27 to increase the feedback voltage causes an increase in the amplitude of the feedback components to modify the response characteristic of the system to that in which the feedback is considerably regenerative at frequencies substantially displaced from resonance, greatly increasing the bandwidth and accentuating the double peaks on either side of the mean resonant frequency. Therefore, for the broad or wide bandwidth position the gain of the tube 27 is a maximum.

It will be appreciated that the system described so far provides a simple means for adjusting the selectivity of a receiver, by adjusting the width of the frequency band transmitted through the I. F. channel of the receiver. Thus, by adjusting the bias potential on the control electrode 30 of the tube 27 in the manner described above, the width of the band transmitted through the I. F. channel of the receiver may easily be varied.

If a negative feedback tube such as tube 27 were not utilized, the bandwidth of the amplifier circuit would be very narrow (e. g., on the order of 450 cycles), and it would, moreover, not be capable of adjustment or variation. When the negative feedback tube 27 is added, the bandwidth is broadened, and may extend from say 450 cycles to say 12,000 cycles.

The description up to this point has assumed that the gain of only tube 27 is varied by means of potentiometer 40. However, it will be observed that the variation of potentiometer 40 also varies the gain of tube 9 in the same direction as that of tube 27. If the gain of only tube 27 were varied, the product of the circuit gain and the circuit bandwidth would be a constant. This means that changing the bandwidth (varying the selectivity) would result in a change in gain, and specifically, that decreasing the bandwidth would result in an increase in gain, and vice versa.

However, as described and claimed in my aforementioned copending application, by controlling the gain of tube 9 simultaneously with that of tube 27, the circuit gain may be maintained substantially constant for all bandwidths. As previously described, by movement of the wiper of potentiometer 40, the bias voltage applied to grid 8 is varied, thereby varying the gain of tube 9.

It will be seen that the grid leak for control grid 8 is provided by resistor 45, that portion of potentiometer 40 below the wiper thereof, and resistor 41.

It will be recalled that adjustment of the wiper of potentiometer 40 in such a direction as to increase the negative potential applied to grid 30 reduces the transconductance (or gain) of tube 27 and narrows the width of the band passed by the Fig. 1 circuit. In the absence of any gain control of tube 9, this would tend to increase the gain of the overall circuit. However, due to the connection of grid 8 to the arm of bias control potentiometer 40, adjustment of this arm in such a direction as to increase the negative potential applied to grid 30, also increases the negative potential applied to grid 8, thus reducing the gain of tube 9 and compensating for the gain increase which would otherwise occur, thus keeping the gain substantially constant even though the bandwidth is narrowed. Then, the gain of tube 9 is reduced for narrower bandwidths.

Conversely, adjustment of the arm of potentiometer 40 in such a direction as to decrease the negative potential applied to grid 30 increases the transconductance or gain of tube 27 and widens or increases the width of the band passed by the Fig. 1 circuit. In the absence of any gain control of tube 9, this would tend to decrease the gain of the overall circuit. However, adjustment of the arm of potentiometer 40 in such a direction as to decrease the negative potential applied to grid 30, also decreases the negative potential applied to grid 8, thus increasing the gain of tube 9 and compensating for the gain reduction which would otherwise occur, thus keeping the gain substantially constant even though the bandwidth is widened. Then, the gain of tube 9 is increased for broader bandwidths.

The position of the wiper on potentiometer 40 thus determines the gain and bandwidth of the Fig. 1 circuit, by varying the bias voltage on tubes 9 and 27, and the gain is maintained approximately constant for all bandwidths.

As previously described, the gain of tube 33 is controlled simultaneously with that of tube 9 and that of tube 27 by means of potentiometer 40, but the gain of tube 33 is controlled in the opposite or inverse direction to the gains of tubes 9 and 27. For the "narrow-band" position of potentiometer 40 the gain of tubes 9 and 27 is a minimum, as previously described. However, for this position the gain of the "regeneration" or positive feedback tube 33 is a maximum, providing a maximum regeneration of input circuit 7. This maximum amount of regeneration or positive feedback increases the effective Q of the resonant circuits, particularly that of circuit 7. This effective increase of the Q of the resonant circuits, resulting from the regeneration provided by tube 33, results in the obtaining of a bandwidth smaller or narrower than could be obtained if such regeneration tube were not utilized, while yet permitting the use of coils of conventional size and design. As an example, if the narrowest bandwith obtainable without the regeneration tube is 450 cycles, the addition of such regeneration tube can bring the bandwidth of the amplifier down to 300 cycles for the "narrow" position of the selectivity control. In other words, bandwidths in the range of 300 to 450 cycles may be added to the range of selectivities by the use of a regeneration tube.

At the "narrow" end of the selectivity control, the minimum bandwidth obtainable can be adjusted by proper choice of the value of resistor 41, which provides initial bias for the positive feedback tube 33.

Movement of the wiper of potentiometer 40 toward the "wide-band" position increases the gain of tubes 9 and 27 by decreasing the negative bias effective thereon and simultaneously increases the negative bias applied to grid 32, thus decreasing the gain of tube 33 and decreasing the amount of positive feedback or regeneration provided thereby. As previously described, the increase of gain of negative feedback tube 27 causes the amplifier bandwidth to increase, while the simultaneous increase of gain of amplifier tube 9 prevents any marked falling off of circuit gain as the bandwidth is increased. At the same time, the regeneration or positive feedback provided by tube 33 is reduced, bringing the Q of circuit 7 down to the proper value. In this way, excessive peaks on the "broad" or "wide-band" position of the selectivity control are avoided.

For practical purposes, a reduction of the bandwidth obtainable on the "narrow-band" position of the selectivity control to half the initial value (that is, the value without a regeneration tube) is sufficient. For a communications receiver, for example, a minimum bandwidth of 500–600 cycles can be expected without a regeneration tube, by using small coils with a Q of approximately 150–200. By using a regeneration or positive feedback tube in accordance with the present invention, a reduction of the minimum bandwidth to 200–300 cycles can easily be achieved, with stable operation of the amplifier.

The regeneration tube 33 has been described above in conjunction with, or in combination with, the negative feedback tube 27. However, it is desired to be pointed out that the purpose of this regeneration tube is to increase the effective Q of the resonant circuit 7. This result takes place entirely independently of the presence or absence of the negative feedback tube 27. In other words, the regeneration tube 33 can be used even without using the negative feedback tube 27, and operates equally effectively in this case.

It has previously been stated that, for broad bandwidths, the frequency response curves are peaked, double peaks appearing on either side of the mean resonant frequency. For a broad bandwidth, the ratio of the height of the peaks to the center of the peaks may be approximately four. This characteristic is illustrated in Fig. 2, wherein five frequency-response (frequency vs. output) curves for the circuit of Fig. 1 are plotted, but it must be pointed out that the third stage 17, 21, etc., was neglected entirely in taking the measurements for the Fig. 2 curves. The frequencies are plotted along the horizontal axis and the D. C. outputs (measured on the diode demodulator) are plotted along the vertical axis. The curves of Fig. 2 involve values actually measured with a circuit of the type described, but without the third stage 17, 21. Curves A, B, C, D, and E are plotted in Fig. 2, curve A being for a very narrow bandwidth B of 285 cycles and curve E being for a wide bandwidth B of 16 kc., as indicated, and curves B, C and D being for bandwidths intermediate these two limits. Considering the curves for broad bandwidths, such as curves D and E, it may be seen that there is a substantial change in circuit output between the two peaks of each of these curves and the respective intercepts of each of these curves with the "0 kc." (actually 150 kc.) vertical line.

To compensate for this rather uneven response in the system passband (on the "broad" selectivity position) a single-tuned circuit 21 is used with the third amplifier stage 17, as previously described. If the circuit 21 has a Q of 60, for example, very good compensation can be achieved.

Figures 3, 5:
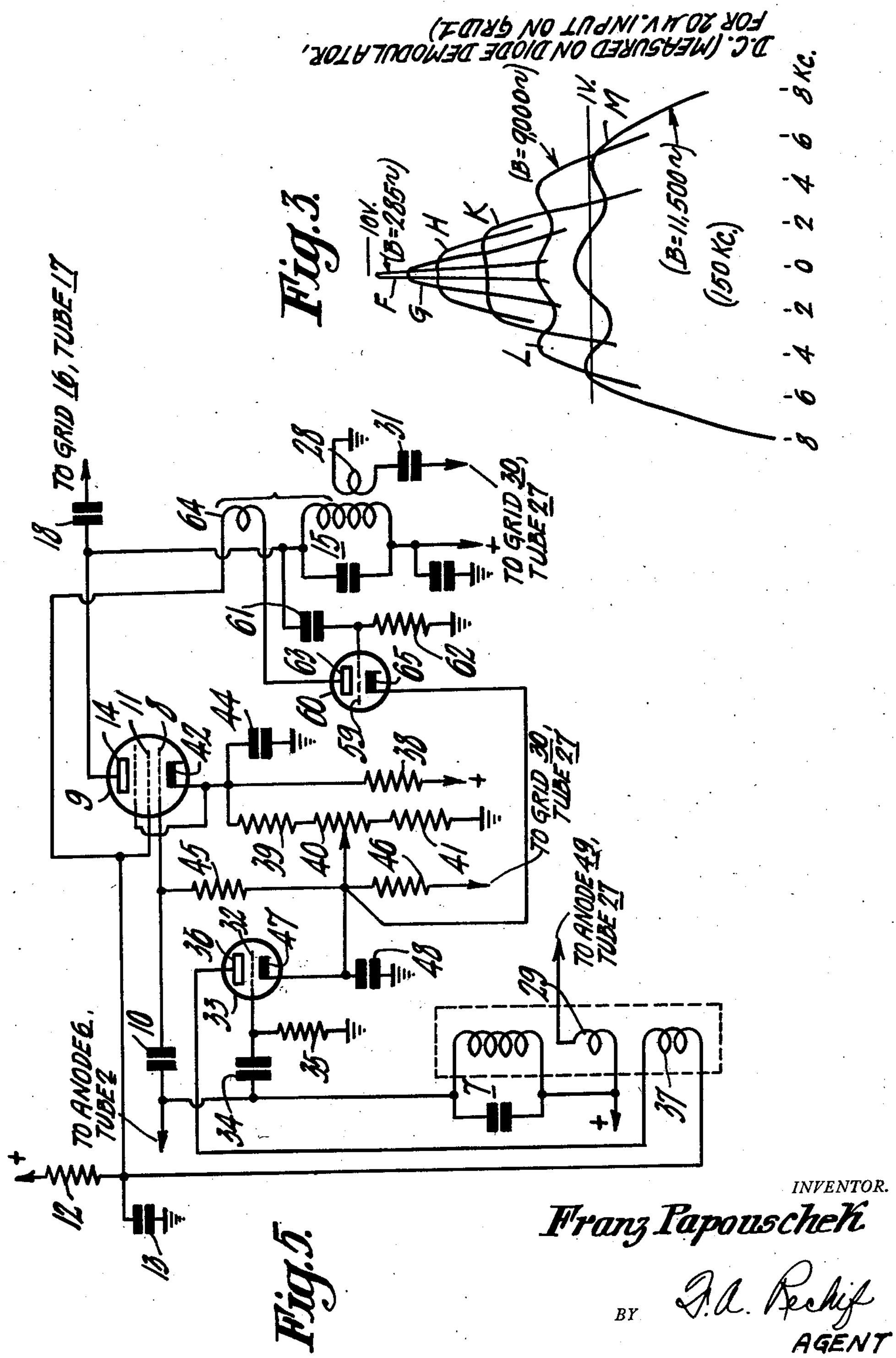
Fig. 5 is a circuit diagram of another modification.

An intermediate frequency amplifier of three stages, of the type shown in Fig. 1, was built and measurements were taken therewith, the results being illustrated in Fig. 3. In Fig. 3, six frequency-response curves for the Fig. 1 circuit are plotted, the frequencies again being plotted along the horizontal axis, and the D. C. outputs (measured on the diode demodulator, for a fixed signal input level on grid 1) being plotted along the vertical axis. Curves F, G, H, K, L and M are plotted in Fig. 3, curve F being for a very narrow bandwidth B of 285 cycles, curve L being for a wide bandwidth B of 9 kc., curve M being for a still wider bandwidth B of 11,500 cycles and curves G, H and K being for intermediate bandwidths. Comparing the broad-bandwidth curves L and M in Fig. 3 with the broad-bandwidth curves in Fig. 2, it may be seen that in Fig. 3 (using the third single-tuned amplifier stage) the change in circuit output, between peaks and valleys of the curves in the passband, is far less than in Fig. 2.

From an examination of Fig. 3, it may be seen that the circuit gain increases slightly toward the narrow bandwidths, but this is not a disadvantage for a receiver because the receiver noise decreases with decreasing bandwidth.

The alignment of the Fig. 1 circuit is very simple, all coils being tuned for maximum gain on the "narrow" selectivity position.

A big advantage of the Fig. 1 circuit is that for bandwidth variation only a potentiometer is necessary, and this can of course be placed anywhere.

The circuit of Fig. 1 can easily replace crystal filters in communications receivers. Moreover, the performance of the circuit of the present invention is incomparably better and no switches or phasing capacitors are necessary.

The circuit of the present invention is very useful for cases where an extremely narrow bandwidth and a wide range of bandwidths are required. This circuit is somewhat better than one with high Q coils and without a regeneration tube, since with the present circuit the Q for the "broad" position is lower and excessive peaks are avoided.

Figure 4:
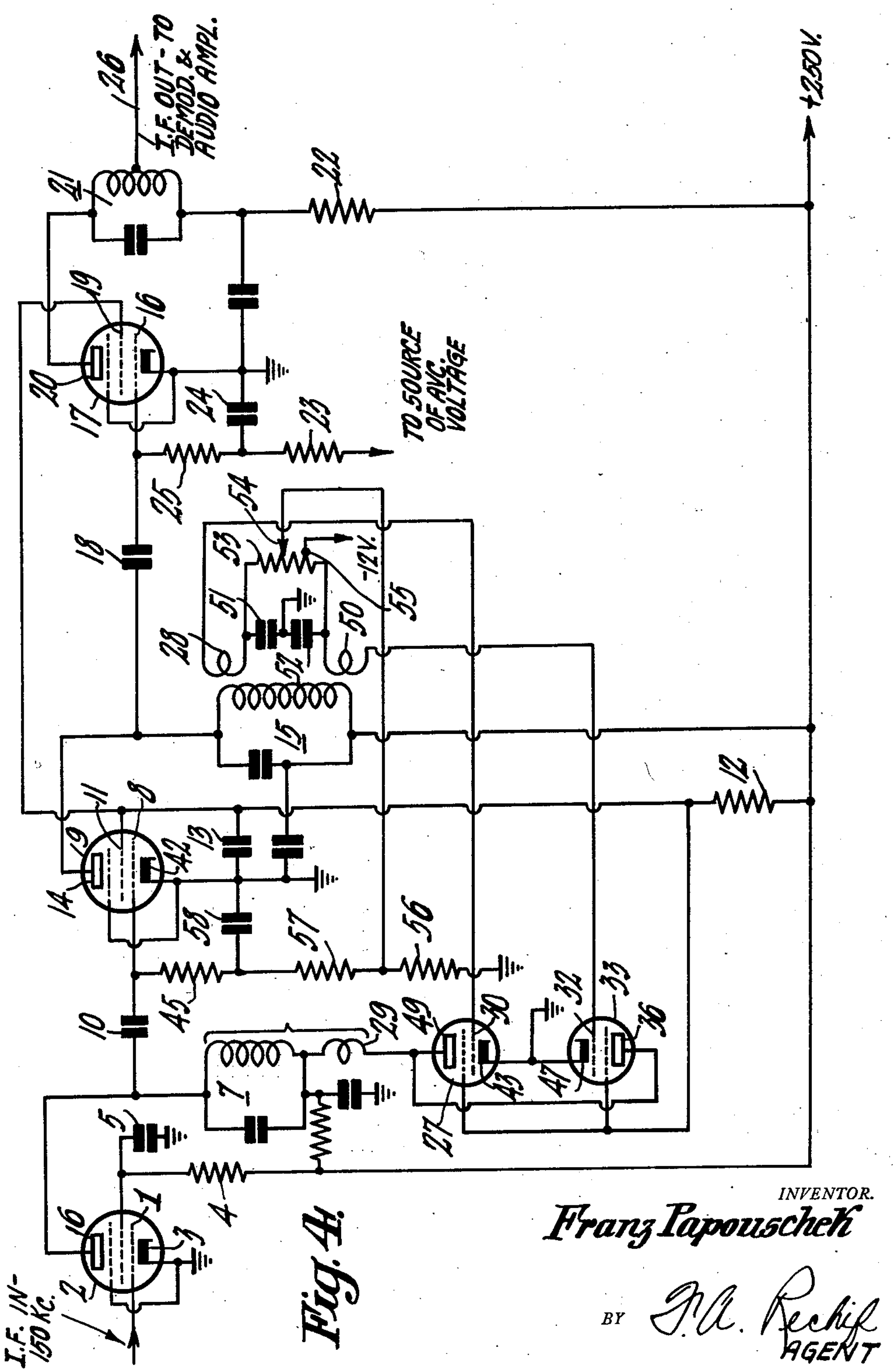
Fig. 4 is a circuit diagram of a modified arrangement.

Fig. 4 discloses a modified arrangement, again using both negative and positive feedback tubes. In this figure, elements the same as those of Fig. 1 are denoted by the same reference numerals. In Fig. 4, both the negative feedback tube 27 and the positive feedback tube or regeneration tube 33 have their inputs coupled to the output resonant circuit 15 and their outputs coupled to the input resonant circuit 7. In other words, one of these tubes (27) provides degenerative coupling between circuits 15 and 7, and the other tube (33) provides regenerative coupling between circuits 15 and 7.

More specifically, in Fig. 4 the winding 28, which is inductively coupled to the inductance of circuit 15 and one end of which is connected to control grid 30 of tube 27, is in push-pull or antiphasal relation to the winding 50, which is also inductively coupled to the inductance of circuit 15 and one end of which is connected to control grid 32 of vacuum tube 33. Since the two couplings to the inductance of circuit 15 are antiphasal, the voltages supplied to the input (grid) circuits of tubes 27 and 33 are also antiphasal, so that if one tube (27) is arranged degeneratively, the other tube (33) is arranged regeneratively. It will be noted that in Fig. 4 the regenerative or positive feedback tube 33 is a tetrode, rather than a triode as in Fig. 1. In order to establish the proper antiphasal coupling between the windings 28 and 50 and the inductance of circuit 15, that end of winding 28 opposite to that connected to grid 30 is connected through a capacitor 51 to ground, while that end of winding 50 opposite to that connected to grid 32 is connected through a capacitor 52 to ground.

It will be recalled that the input couplings to tubes 27 and 33 from output reasonant circuit 15 are antiphasal with respect to each other. The output couplings from tubes 27 and 33 to the input resonant circuit 7 are cophasal. Thus, the anode 49 of tube 27 and the anode 36 of tube 33 are directly connected together and to the winding 29 which is inductively coupled to the inductance of input reasonant circuit 7. To complete the circuit, the cathode 43 of tube 27 and the cathode 47 of tube 33 are both grounded. By means of the connections described, with proper arrangement of the polarities of windings 28 and 50, tube 27 may be made to provide degenerative or negative feedback between circuits 15 and 7, while tube 33 may be made to provide regenerative or positive feedback between the same resonant circuits.

In Fig. 4, as in Fig. 1, a variable bias voltage arrangement is provided for varying simultaneously the gains of all the tubes 9, 27 and 33, the gains of the amplifier tube 9 and of the negative feedback tube 27 being varied in the same direction and these gains being varied oppositely or inversely to that of the positive feedback tube 33. The bias voltage arrangement referred to includes a potentiometer 53 having a movable arm or wiper 54 and a fixed tap 55 thereon. A negative bias voltage, 12 volts for example, derived from a suitable bias potential source, is applied to the tap 55, while opposite ends of potentiometer 53 are connected to the respective ungrounded plates of capacitors 51 and 52, so that the bias potentials at the ends of potentiometer 53 are applied to the respective control grids 30 and 32 of tubes 27 and 33. The wiper 54 is connected through a resistor 56 to ground. By means of the connections described, movement of the wiper 54 on potentiometer 53 varies the bias applied to tubes 27 and 33 simultaneously, but in opposite directions, since the two control grids are connected to respective opposite ends of said potentiometer. In other words, the potentiometer 53 provides a common control for degeneration and regeneration.

The potentiometer wiper 54 is also connected through two series resistors 57 and 45 to the control grid 8 of tube 9, a bypass capacitor 58 being connected from the junction of resistors 45 and 57 to ground. Thus, the potential on wiper 54 is applied as a biasing voltage to tube 9.

The operation of the Fig. 4 circuit is substantially the same as that of the Fig. 1 circuit, previously described. The position of the wiper 54 on potentiometer 53 determines the gain and bandwidth of the amplifier circuit, by varying the bias voltage on tubes 9 and 27, and the gain is maintained approximately constant for all bandwidths between the initial bandwidth (without regeneration or degeneration) and the broadest bandwidth, since the gain of the amplifier tube 9 and of the negative feedback tube 27 are varied simultaneously in the same direction. Again, the gain of tube 33 is controlled in the opposite or inverse direction to the gains of tubes 9 and 27, this regeneration tube 33 (when its gain is a maximum) effectively increasing the Q of the resonant circuits and lowering or reducing the minimum bandwidth obtainable, for example down to 400 cycles bandwidth.

It has been stated that with the circuit of Fig. 4 the gain is constant between the initial bandwidth (i. e., without regeneration or degeneration) and the broadest bandwidth. With regeneration, the gain increases with decreasing bandwidth. Initially, a double potentiometer (ganged) was used to keep the gain constant even for this region, but the circuit of Fig. 4, using a tapped potentiometer, was chosen because of the increased sensitivity (increased gain) for extremely small bandwidths.

With the circuit arrangement disclosed (in which the gains of all three tubes 9, 27 and 33 are controlled simultaneously, in the proper relation to each other), the gain is held approximately constant over a range of amplifier bandwidths from 400 cycles to 10,000 cycles, the gain increasing slightly for bandwidths below 400 cycles, and a range of bandwidths of from 100 to 10,000 cycles can easily be obtained.

Fig. 5 is a modification of the Fig. 1 arrangement. In Fig. 5 certain details of circuitry have been omitted in order to simplify the drawing, and in this figure elements the same as those of Fig. 1 are denoted by the same reference numerals. In Fig. 5, an additional "regeneration tube" is used in conjunction with resonant circuit 15, for regenerating this resonant circuit.

In Fig. 5, signal energy appearing at the anode end of circuit 15 is applied to the grid 59 of a triode vacuum tube 60 through a coupling capacitor 61 over a grid leak resistor 62 which is connected between grid 59 and ground. Anode 63 of tube 60 is connected through a coil 64 and resistor 12 to the positive source of unidirectional potential. Coil 64 is inductively coupled to the inductance of resonant circuit 15.

Tube 60 is connected as a regenerative feedback tube or a positive feedback tube, the energy abstracted from the anode circuit of tube 9 (and fed to grid 59 of tube 60) being amplified by triode 60 and fed back regeneratively to output resonant circuit 15. Coil 64 is so related to the inductance of resonant circuit 15 that this feedback is regenerative or in the "positive" direction.

A common variable or adjustable biasing circuit is provided for tubes 9, 27 (the negative feedback tube, not shown in Fig. 5), 33 and 60. The common potentiometer 40 is used to vary the bias potential applied to all of these tubes (and therefore the gain of each tube) simultaneously. The cathode 65 of positive feedback tube 60 is connected to the movable arm of potentiometer 40. Thus, a variable or adjustable bias potential is applied between the cathode and grid of tube 60 (the grid 59 of tube 60 is at zero D. C. potential), and variation of the arm or wiper on potentiometer 40 also causes the gain of tube 60 to be varied, simultaneously or concomitantly with the gains of tubes 9 and 33. It will be noted that the cathode 65 of tube 60 and the cathode 47 of tube 33 are connected to the wiper of potentiometer 40 while the grid of tube 9 is connected to this same wiper. Therefore, movement or variation of said wiper varies the gains of the two tubes 60 and 33 in the same direction, and inversely or oppositely to that of tube 9. The bias potential applied to grid 8 of tube 9 is generally negative with respect to the potential of the cathode 42. The bias potentials applied to cathodes 47 and 65 of respective tubes 33 and 60 are generally positive with respect to ground (the potentials of grids 32 and 59).

The Fig. 5 circuit includes a negative feedback tube 27 (not shown), which operates in exactly the same fashion as that in Fig. 1, previously described. The position of the wiper on potentiometer 40, as in Fig. 1, determines the gain and bandwidth of the amplifier circuit, by varying the bias voltage on tubes 9 and 27, and the gain is maintained approximately constant for all bandwidths between the initial bandwidth (without regeneration or degeneration) and the broadest bandwidth, since the gain of the amplifier tube 9 and of the negative feedback tube 27 are varied simultaneously in the same direction.

Tube 33 regenerates circuit 7, providing positive feedback to this resonant circuit. In Fig. 5, tube 60 regenerates circuit 15, providing positive feedback to resonant circuit 15. The gain of tube 33 and the gain of tube 60 are both controlled in the opposite or inverse direction to the gains of tubes 9 and 27. The combination of the two regeneration tubes 33 and 60 (when their gains are a maximum) effectively increases the Qs of both resonant circuits (7 and 15) and reduces the minimum bandwidth as compared to the minimum bandwidth obtainable without these regeneration or positive feedback tubes. If, for example, the minimum bandwidth obtainable is 400 cycles with a single regeneration tube 33, then the addition of a second regeneration tube 60 as in Fig. 5 (for regenerating the "output" resonant circuit 15) will result in a further reduction of the minimum obtainable bandwidth, for example down to 50 cycles.

What is claimed is:

1. An amplifier of variable selectivity comprising an input resonant circuit, an output resonant circuit, a first variable-transconductance electron discharge device coupling said circuits in the forward direction, a second variable-transconductance electron discharge device coupling said circuits in the backward direction to provide a negative feedback voltage from said output circuit to said input circuit, a third variable-transconductance electron discharge device connected to abstract alternating signal energy from said input resonant circuit, to amplify such energy, and to feed the amplified alternating signal energy regeneratively back into said input resonant circuit, and manually-adjustable means for simultaneously varying the transconductances of all three of said devices.

2. An amplifier of variable selectivity comprising an input resonant circuit, an output resonant circuit, a first variable-transconductance electron discharge device coupling said circuits in the forward direction, a second variable-transconductance electron discharge device coupling said circuits in the backward direction to provide a negative feedback voltage from said output circuit to said input circuit, a third variable-transconductance electron discharge device connected to abstract wave energy from said input resonant circuit, to amplify such energy, and to feed the amplified energy regeneratively back into said input resonant circuit, and manually-adjustable means for simultaneously varying the transconductances of all three of said devices, the variation of transconductance of said third device being in a direction opposite to that of said first and second devices.

References Cited in the file of this patent

UNITED STATES PATENTS

| | | |
|---|---|---|
| 2,152,618 | Wheeler | Mar. 28, 1939 |
| 2,173,426 | Scott | Sept. 19, 1939 |
| 2,173,427 | Scott | Sept. 19, 1939 |
| 2,243,907 | Johanssen | June 3, 1941 |
| 2,255,757 | Bierwirth | Sept. 16, 1941 |
| 2,298,629 | Shaper | Oct. 13, 1942 |
| 2,306,859 | Berthold | Dec. 29, 1942 |
| 2,672,529 | Villard, Jr. | Mar. 16, 1954 |